United States Patent
Takasou

(12)
(10) Patent No.: US 6,274,447 B1
(45) Date of Patent: *Aug. 14, 2001

(54) SEMICONDUCTOR DEVICE COMPRISING A MOS ELEMENT AND A FABRICATION METHOD THEREOF

(75) Inventor: Tomoo Takasou, Nagano-ken (JP)

(73) Assignee: Seiko Epson Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/821,251

(22) Filed: Mar. 19, 1997

(30) Foreign Application Priority Data

Mar. 22, 1996 (JP) .................................................. 8-066006
Feb. 10, 1997 (JP) .................................................. 9-41522

(51) Int. Cl.[7] .................................................. H01L 21/00

(52) U.S. Cl. .................... 438/305; 438/528; 438/592

(58) Field of Search .................................... 438/301, 305, 438/592, 528

(56) References Cited

U.S. PATENT DOCUMENTS

| | | | |
|---|---|---|---|
| 4,683,645 | * | 8/1987 | Naguib et al. . |
| 5,956,617 | * | 9/1999 | Kimura et al. ................... 438/682 |
| 6,004,871 | * | 12/1999 | Kittl et al. ........................ 438/592 |
| 6,051,494 | * | 4/2000 | Iwamatsu et al. ................ 438/683 |

FOREIGN PATENT DOCUMENTS

| | | |
|---|---|---|
| 6-232390 | 8/1994 | (JP) . |
| WO94/24697 | * 10/1994 | (WO) . |

OTHER PUBLICATIONS

Minoru Takahashi, et al. "Anomalous Resistance in 0.1μm–Region Ti–Silicided Ply Si Gate", Extended abstracts of the 1993 International Conference on Solid State Devices and Materials, Makuhari, 1993, pp. 458–460.

I. Sakai, et al., "A New Salicide Process (PASET) for Sub–half Micron CMOS", 1992 Symposium on VLSI Technology Digest of Technical Papers, pp 66–67.

Hitoshi Wakabayashi, et al., "Si–Surface Amorphization Effects and SEDAM Method for Low–Resistance TiSi2 Film Formation", The Institute of Electronics, pp 77–83, date unknown.

* cited by examiner

*Primary Examiner*—Richard Booth
(74) *Attorney, Agent, or Firm*—Hogan & Hartson, LLP

(57) ABSTRACT

This invention provides a method of fabricating a semiconductor device comprising a MOS element, and comprises the steps of:

(A) forming a conductive layer comprising at least silicon on a semiconductor substrate, with an insulating film therebetween;

(B) diffusing impurities to act as donors or acceptors into the semiconductor substrate, to form an impurity diffusion layer for configuring a source region or drain region;

(C) forming a metal layer capable of creating a silicide, on at least the surfaces of the conductive layer and the impurity diffusion layer; and (D) performing thermal processing to convert the metal layer into a silicide;

wherein this method further comprises a step of using ion implantation to implant atoms that do not function as donors or acceptors, such as argon or krypton, into at least the conductive layer and the impurity diffusion layer, before the step (C) of forming the metal layer to make the surface of the impurity diffusion layer non-crystalline.

4 Claims, 8 Drawing Sheets

Line width of silicide layer at gate electrode (μm)

Line width of silicide layer at source/drain diffusion layers (μm)

SEMICONDUCTOR DEVICE COMPRISING A MOS ELEMENT AND A FABRICATION METHOD THEREOF

BACKGROUND OF THE INVENTION

1. Field of the Invention

This invention relates to a semiconductor device comprising a MOS element formed by a salicide technique, in other words, a MOS element in which metal silicide layer is formed over the surfaces of the gate electrode and source/drain regions thereof, and a fabrication method thereof.

2. Field of the Invention

Electronic devices have recently followed a path towards even smaller dimensions, with the aim of creating semiconductor integrated circuits with even greater densities and more sophisticated capabilities. This reduction in dimensions has led to a situation in which there is no option but to achieve narrower widths and shallower depths of impurity diffusion layers that form the source/drain regions (source regions or drain regions) of MOS transistors. However, as the source/drain regions become shallower, the sheet resistance of these impurity diffusion layers rises so far that the channel resistances of the transistors can no longer be ignored and, as a result, the capabilities of the semiconductor integrated circuits are degraded by delays and other problems.

A self-aligned-silicide (salicide) technique is useful for countering these problems. This technique is used to convert the surfaces of the source/drain regions and the gate electrode, which consists of polycrystalline silicon, into a self-aligned silicide, as stated in, for example: LSI Handbook, edited by The Institute of Electronics and Communication Engineers and published by Ohmsha Ltd., p. 401. Use of the salicide technique makes it possible to lower the resistance of the source/drain regions, as necessitated by even smaller dimensions.

However, it is known that the silicification reaction is suppressed and the sheet resistance increases, either because of the high-density impurities present in the gate electrode and the source/drain regions, particularly that of arsenic used in n-channel MOS transistors, or because of the smaller dimensions necessitated by the narrower widths of the source/drain regions and the gate electrode, as has been disclosed in:

(1) Robert Beyers et. al., J. Appl. Phys. 61 (11) 1987

(2) Minoru Takahashi et. al., Ext. Abs. 1993 SSDM, p. 458

A known method of counteracting this problem is to use ion implantation before the silicification, to implant arsenic ions into the surfaces of the source/drain regions and the gate electrode, which consists of polycrystalline silicon, to make the silicon non-crystalline and thus create a low-resistance silicide.

This method is disclosed in:

(1) Hitoshi Wakabayashi et. al., Technological Research Report SDM95-173 by The Institute of Electronic, Information and Communication Engineers (2) I. Sakai et. al. Digest 1992 Symposium on VLSI Technology, p. 66

The technique described by these papers uses a method by which impurities are implanted into the source/drain regions and gate electrode of the transistor to make the semiconductor conductive and, after that impurities are activated, arsenic is implanted therein to make the surfaces of the source/drain regions and gate electrode non-crystalline, and then the silicide layer is formed.

However, according to the technique used to implant the arsenic with the objective of creating the non-crystalline surfaces, if ion implantation is used to bombard the entire surface of the semiconductor substrate with arsenic to make it non-crystalline, that arsenic could cause counter-doping with respect to the layer of diffused p-type impurity, such as boron, so that the density of the p-type impurity in the impurity layer becomes relatively low. In order to prevent this, it is necessary to use a photoresist and pattern it so that the arsenic bombards only the n-type regions. However, this method increases the number of steps and the number of photomasks used for the patterning during ion implantation, leading to an increase in wafer processing costs.

SUMMARY OF THE INVENTION

The objective of this invention is therefore to provide a semiconductor device comprising a MOS element, in which any rise in sheet resistance due to the reduced dimensions of the source/drain regions and the gate electrode is suppressed, and a method of fabricating such a device.

In accordance with one aspect of this invention, a method of fabricating a semiconductor device comprising a MOS element, the MOS element comprises: a gate electrode consisting of a conductive layer comprising at least silicon that is formed on a substrate with an insulating film therebetween; an impurity diffusion layer configuring a source region or drain region that is formed within the semiconductor substrate; and a metal silicide layer on the surfaces of the gate electrode and the impurity diffusion layer; the method of fabricating a semiconductor device comprising the steps of:

(A) forming a conductive layer comprising at least silicon on the semiconductor substrate, with an insulating film therebetween;

(B) diffusing impurities to act as donors or acceptors into the semiconductor substrate, to form an impurity diffusion layer for configuring a source region or drain region;

(C) forming a metal layer capable of creating a silicide, on at least the surfaces of the conductive layer and the impurity diffusion layer; and (D) performing thermal processing to convert the metal layer into a silicide;

wherein the fabrication method comprises a further step of using ion implantation to implant atoms that do not function as donors or acceptors into at least the conductive layer and the impurity diffusion layer, before the step (C) of forming the metal layer.

The semiconductor device of this invention, which is produced by the fabrication method of this invention, comprises a MOS element having a gate electrode consisting of a conductive layer comprising at least silicon that is formed on a semiconductor substrate with an insulating film therebetween; an impurity diffusion layer for configuring a source region or drain region that is formed within the semiconductor substrate; and a metal silicide layer on the surfaces of the gate electrode and the impurity diffusion layer;

wherein atoms that do not function as donors or acceptors are introduced by ion implantation into the impurity diffusion layer, in addition to impurities that act as donors or acceptors.

In other words, the fabrication method of this invention uses ion implantation to implant ions of specific atoms that do not function as donors or acceptors into the surfaces of the conductive layer that configures the gate electrode of the MOS element and the impurity diffusion layers that configure the source/drain regions, before the step (C) of forming the metal layer that enables the creation of a silicide, to make the surfaces of this conductive layer and the impurity diffusion layers non-crystalline(amorphous). This step increases the reactivity of the silicon configuring these layers and thus makes it possible to perform the silicification reliably. Therefore, if the width of the gate electrode and impurity diffusion layers have become narrower as a result of the reduction in dimensions of elements, and even if the depths of these impurity diffusion layers have also become shallower, it is possible to suppress any rise in the sheet resistance of the metal silicide layers and also, since there is no counter-doping with respect to both n-type and p-type impurities, it is possible to obtain satisfactory metal silicide layers without affecting the impurity density.

In the semiconductor device and fabrication method of this invention, these atoms that do not function as donors or acceptors are at least one of noble gas selected from a group consisting of argon, krypton, neon, helium, and xenon, or at least one selected from a group consisting of silicon, germanium, carbon, and tin. Argon is even more preferable.

Since these atoms do not function as donors or acceptors, they have no effect on the density of donors or acceptors comprises within the source/drain regions. These atoms are of a suitable mass and quantity to enable efficient and reliable conversion of the silicon of the layers to be processed into the non-crystalline form by the ion implantation.

In the semiconductor device and fabrication method of this invention, it is preferable that any crystal defects created by the atoms that do not function as donors of acceptors, or crystal defects created by a process of repairing the crystal defects by subsequent thermal processing, are present within the impurity diffusion layer. In other words, these crystal defects preferably do not extend past the outer sides of the impurity diffusion layers that form the source/drain regions. As a result, the leakage currents generated by the junctions between the source/drain impurity diffusion layers and the well diffusion layer can be kept to the same level as that when this ion implantation is not performed with the aim of making the silicon non-crystalline.

For that reason, the implantation energy used during the implantation of the ions of atoms that do not function as donors or acceptors, such as argon ions, with the objective of creating the non-crystalline surfaces, is preferably such that crystal defects created by that ion implantation, or crystal defects created by a process of repairing the crystal defects by subsequent thermal processing, do not extend further than the depths of the impurity diffusion layers of the source/drain regions of the MOS element.

With the fabrication method of this invention, the specific atoms introduced by the ion implantation for making the surfaces non-crystalline do not change the impurity density of the impurity diffusion layers of the source/drain regions, as described above, so that this ion implantation can be used in the simultaneous fabrication of both n-type and p-type MOS elements during the fabrication of a semiconductor device comprising both n-channel and p-channel MOS elements. Therefore, ions of atoms that do not function as donors or acceptors can be implanted over the entire surface of the wafer, without necessitating a step of forming a mask to prevent counter-doping.

As described above, the creation of non-crystalline silicon surfaces by the implantation of ions of atoms that do not function as donors or acceptors, such as argon ions, in the semiconductor device and fabrication method of this invention ensures that there is no counter-doping with respect to the p-type or n-type impurities comprised within the source/drain regions. This makes it possible to obtain satisfactory silicification of the impurity diffusion layers, with the density of these impurities controlled accurately.

Since this creation of non-crystalline silicon by the implantation of ions of atoms that do not function as donors or acceptors ensures that there is no counter-doping with respect to the p-type or n-type impurities comprises within the source/drain regions. Therefore, the entire wafer surface can be subjected to ion implantation simultaneously, so that the surfaces of the polycrystalline silicon layer that is the gate electrode and the monocrystalline silicon layers that are the source/drain regions can be made non-crystalline, and thus it is not necessary to bombard the device with ions following the photoprocessing, which makes it possible to reduce the wafer processing costs.

The semiconductor device of this invention makes it possible to reduce the sheet resistance of the MOS elements and also suppress the junction leakage currents. It is preferably used in a battery-powered appliance such as a cellular telephone, a notebook-sized computer, an electronic organizer, a pager, or a pocket game. This means that the current dissipated when the device is on standby can be reduced and thus it is possible to extend the lifetime of batteries used therein.

DETAILED DESCRIPTION OF PREFERRED EMBODIMENTS

Typical embodiment of this invention will be described below in detail with reference to the accompanying figures.

configuration of First Embodiment

Figure 3:
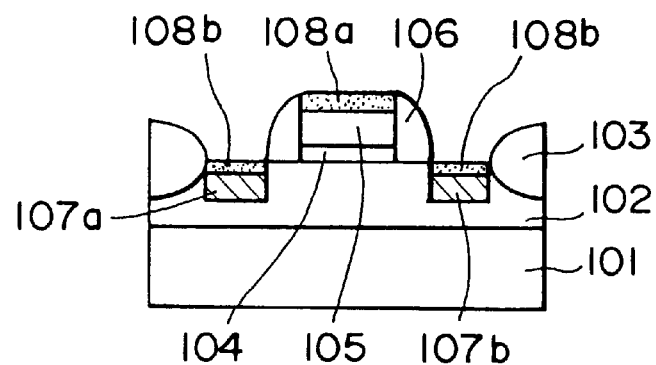
FIG. 3 is a schematic cross-sectional view of a further step in the method of fabricating a semiconductor device in accordance with the first embodiment of this invention.
Figure 4:
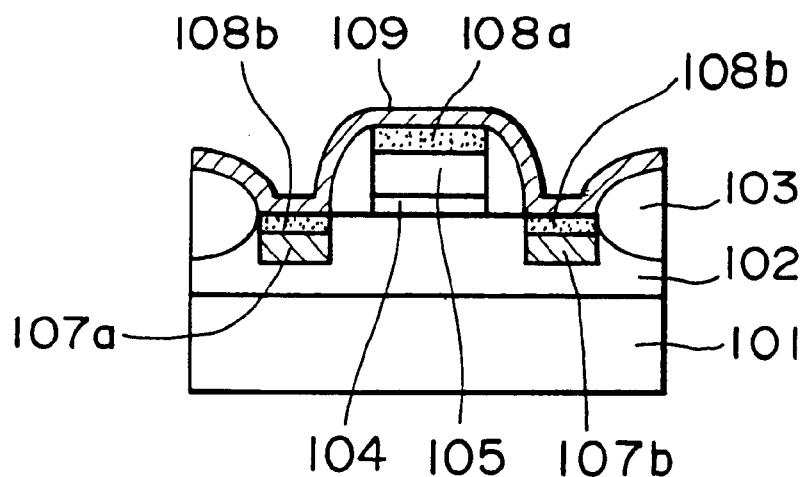
FIG. 4 is a schematic cross-sectional view of a still further step in the method of fabricating a semiconductor device in accordance with the first embodiment of this invention.
Figure 5:
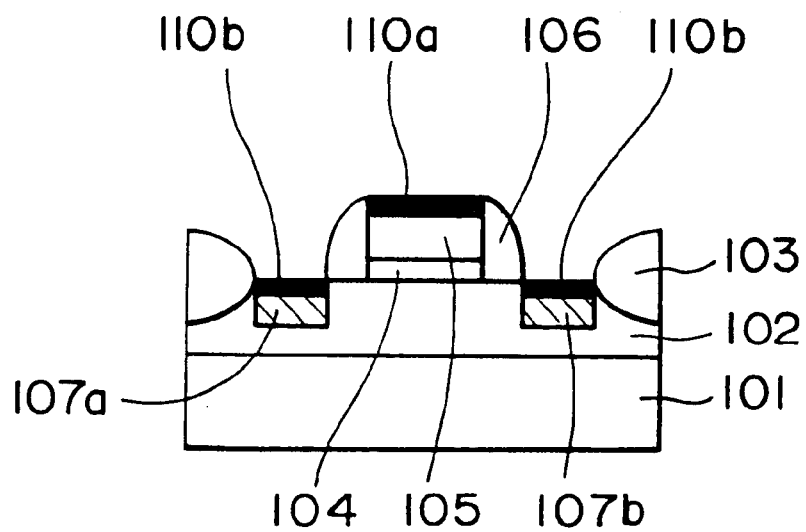
FIG. 5 is a schematic cross-sectional view of the semiconductor device obtained by the fabrication method shown in FIGS. 1 to 4.

A schematic cross-sectional view of an example of a semiconductor device of this invention is shown in FIG. 5, and schematic cross-sectional views of steps in an example of a method of fabricating the semiconductor device of FIG. 5 are shown in FIGS. 1 to 4.

The configuration of this embodiment is an example of the application of this invention to a semiconductor device comprising an n-channel MOS element.

The semiconductor device of FIG. 5 comprises a silicon substrate 101, a p-type well diffusion layer 102 formed within this substrate 101, an element separation region 103 formed over this silicon substrate 101, a gate electrode 105 formed over the silicon substrate with a gate oxide film 104 therebetween, side-wall spacers 106 formed on either side of this gate electrode 105, and source/drain regions 107a and 107b comprising an n-type impurity and formed in the p-type well diffusion layer 102.

The gate electrode 105 is formed of polycrystalline silicon into which is doped an n-type impurity such as phosphorous, and a first metal silicide layer 110a is formed on the surface of this gate electrode 105. A second metal silicide layer 110b is formed on the surface of the source/drain regions 107a and 107b.

Atoms that do not function as donors or acceptors, such as argon atoms, are present in the first and second metal silicide layers 110a and 110b, introduced therein by ion implantation. These atoms remain in the gate electrode 105 and source/drain regions 107a and 107b after ion implantation, to promote the silicification, as will be described later.

The semiconductor device of FIG. 5 could be fabricated by a process such as that shown in FIGS. 1 to 4 and described below.

(1) First of all, a first silicon oxide film is formed in an oxygen environment on the silicon substrate 101. Photoresist for the creation of a well diffusion layer is applied thereto then patterned by a projected-light method to form a mask. Boron is implanted by an ion implantation method then, after the photoresist has been removed, the p-type well diffusion layer 102 is formed by a thermal diffusion method. After a silicon nitride film has been formed by chemical vapor deposition (CVD), photoresist is again applied and patterned, and a portion of the silicon nitride film which will form an element separation region in the first silicon oxide film is removed by dry etching. Next, after the photoresist has been removed, this silicon nitride film is used as a mask to form the element separation region 103 from the silicon oxide film by subjecting it to thermal oxidation in an oxygen environment.

Figure 1:
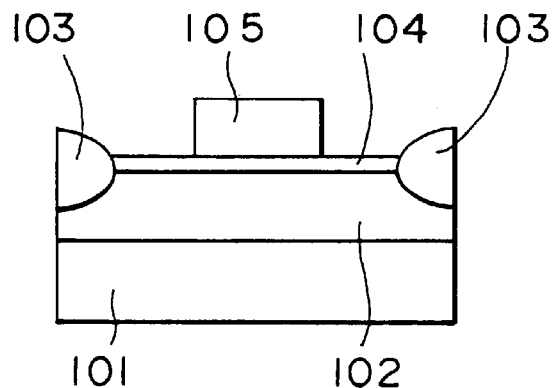
FIG. 1 is a schematic cross-sectional view of a step in the method of fabricating a semiconductor device in accordance with a first embodiment of this invention.

The silicon nitride film is removed by means such as phosphoric acid, thermal oxidation is performed to remove impurities from the substrate surface before the gate oxide film is formed thereon, and a second silicon oxide film is formed. After this second silicon oxide film has been removed by etching, a thermal oxidation method is used to form the gate oxide film 104. A polycrystalline silicon layer is next formed by CVD, photoresist is applied and patterned, then dry etching is performed to form the gate electrode 105 and the photoresist is removed (FIG. 1).

Figure 2:
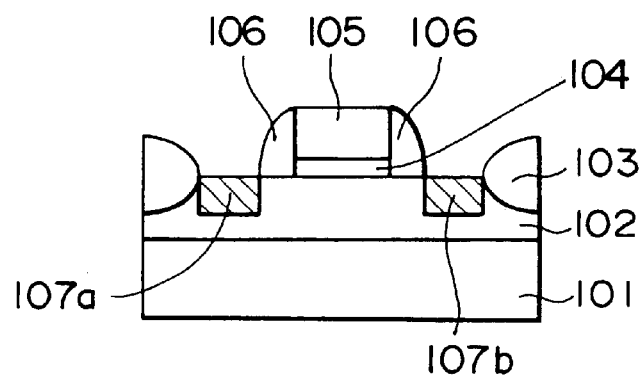
FIG. 2 is a schematic cross-sectional view of another step in the method of fabricating a semiconductor device in accordance with the first embodiment of this invention.

(2) Next, to prevent shorting between the gate electrode and the source/drain regions after the silicification, an oxide film is formed by CVD then dry etching is performed to form the side-wall spacers 106. Photoresist is next applied for the creation of the source/drain regions of the n-channel MOS transistor and the implantation of impurities into the gate electrode 105, and this photoresist is patterned in such a manner that an aperture is formed in a portion corresponding to the region in which the n-channel MOS transistor will be formed. An n-type impurity such as arsenic is then implanted by an ion implantation method to form each of source/drain regions 107a and 107b that are high-density n-type diffusion layers and also introduce this impurity into the gate electrode 105, and then the photoresist is removed. Finally, thermal processing is performed in a nitrogen environment to activate the implanted impurities (FIG. 2).

(3) After any natural oxide film or the like that is present on the surfaces of the gate electrode 105 and source/drain regions 107a and 107b have been removed, argon ions are implanted to make the surfaces of the gate electrode 105 and source/drain regions 107a and 107b non-crystalline. If the depth of the source/drain regions 107a and 107b is 0.2 $\mu$m, for example, and thermal processing is performed after the argon ion implantation for 20 minutes at 800 to 900° C., the implantation energy during this time is preferably no more than 15 keV, for example, to ensure that crystal defects created by the implanted argon ions, or crystal defects created by a process of repairing those crystal defects by subsequent thermal processing, do not extend further than the depths of the source/drain regions 107a and 107b. In this manner, non-crystalline regions 108a and 108b are formed in the surfaces of the gate electrode 105 and source/drain regions 107a and 107b (FIG. 3).

This step is important in that the implantation of specific ions such as argon ions into the surfaces of the gate electrode 105 and source/drain regions 107a and 107b encourages the silicon thereof to become non-crystalline. It should be noted, however, that it is preferable that this ion implantation is performed in such a manner that any crystal defects formed by the ion implantation do not extend beyond the source/drain regions. In other words, it is preferable that any crystal defects created by these ions of specific atoms such as those of argon, or crystal defects created by a process of repairing the crystal defects by subsequent thermal processing, do not extend past the outer sides of the source/drain regions 107a and 107b. As a result, the leakage currents generated by the junctions between the source/drain regions and the well diffusion layer can be kept to the same level as that when this ion implantation is not performed with the aim of making the silicon non-crystalline. For that reason, it is preferable that the implantation energy used during the implantation of ions of atoms that do not function as donors or acceptors, such as argon ions, is set to provide conditions such that these crystal defects do not extend further than the depths of the impurity diffusion layers of the source/drain regions.

(4) Next, sputtering is used to form a metal layer 109, which is a layer of a metal that enables the creation of a silicide, such as titanium, cobalt, nickel, tantalum or platinum, or an alloy thereof (FIG. 4). A lamp annealer such as a halogen lamp annealer is then used to subject the device to thermal processing, to form metal silicide layers 110a and 110b in a self-aligned manner on the surfaces of the gate electrode 105 and source/drain regions 107a and 107b. Selective etching is then performed to remove the non-reactive metal layer from the side-wall spacers 106 and the element separation region 103 (FIG. 5).

As described above, the fabrication method of this invention has a step (3) in which ion implantation is used to implant ions of specific atoms that do not function as donors or acceptors into the surfaces of the gate electrode 105 consisting of polycrystalline silicon and the source/drain regions 107a and 107b consisting of n-type impurity diffusion layers, to make these surfaces non-crystalline, before the step (4) of forming the metal layer that enables the creation of a silicide. This increases the reactivity of the silicon configuring the gate electrode 105 and the source/drain regions 107a and 107b consisting of n-type impurity diffusion layers, making it possible to perform the silicification reliably. Therefore, if the widths of the gate electrode and source/drain regions have become narrower because of the reduction in element dimensions, and even if the source/drain regions have also become shallower, any rise in the sheet resistance of the metal silicide layers can be suppressed and also satisfactory silicification can be obtained without affecting the impurity densities in the source/drain regions that comprise n-type impurities, particularly arsenic which can easily impede the silicification. Since the ions that are implanted are argon, not an n-type or p-type impurity such as arsenic, phosphorous, or $BF_2$, there is no danger of counter-doping with respect to other impurities.

Note that the above described embodiment was described as being related to an n-channel MOS transistor, but it should be obvious to those skilled in the art that the present invention can also be applied to a p-channel MOS transistor in a similar manner to achieve the same functions, with the only main difference being the opposite polarity of the conductivity types.

The description now turns to experimental samples used in relation to the MOS element configured in accordance with this embodiment.

EXPERIMENTAL SAMPLES (1) Secondary Ion Mass Spectrometry (SIMS)

Figure 6:
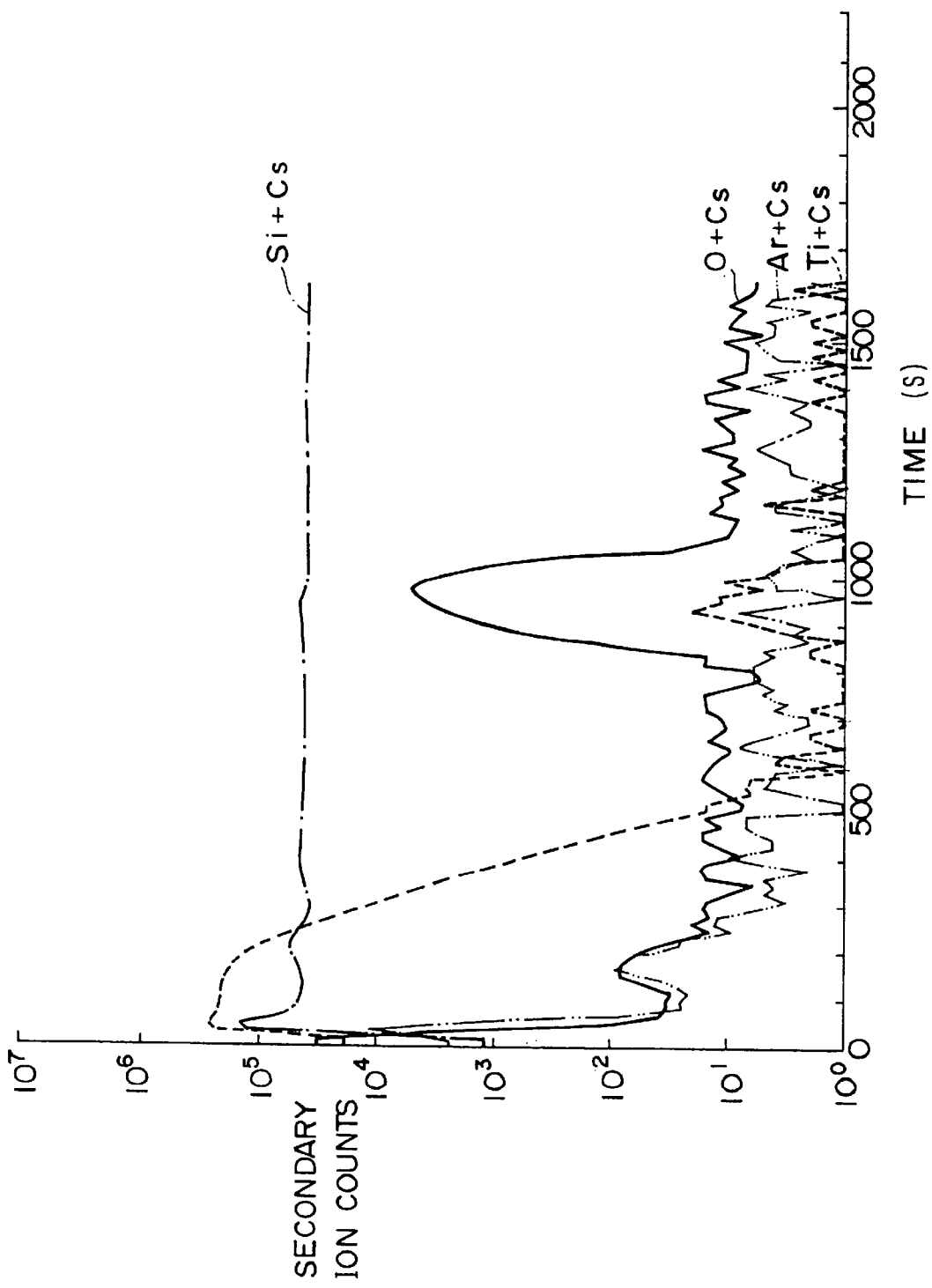
FIG. 6 is a graph of SIMS spectrum of a sample of the semiconductor device in accordance with the first embodiment of this invention.

A sample was fabricated on the basis of the previously described process, and the profiles of atoms in the film-thickness direction of the samples were obtained by SIMS using the irradiation of primary cesium ions. The results are shown in FIG. 6. The sample used in the measurements was fabricated to have a silicon oxide film (10 nm) acting as the gate oxide film, a polycrystalline silicon layer (220 nm) that is the gate electrode into which arsenic was doped with an implantation energy of 50 keV and at a dosage of $4\times10^{15}/cm^2$, and a titanium silicide layer (70 to 80 nm), on a silicon substrate. During the fabrication of the sample, argon ions were implanted by an implantation energy of 10 keV in step (3).

It can be seen from FIG. 6 that there was an argon peak in the vicinity of the surface of the titanium silicide layer that is the uppermost layer, and within the layer itself.

(2) Effect of Argon Ion Implantation on Sheet Resistance of Gate Electrode

Figure 7:
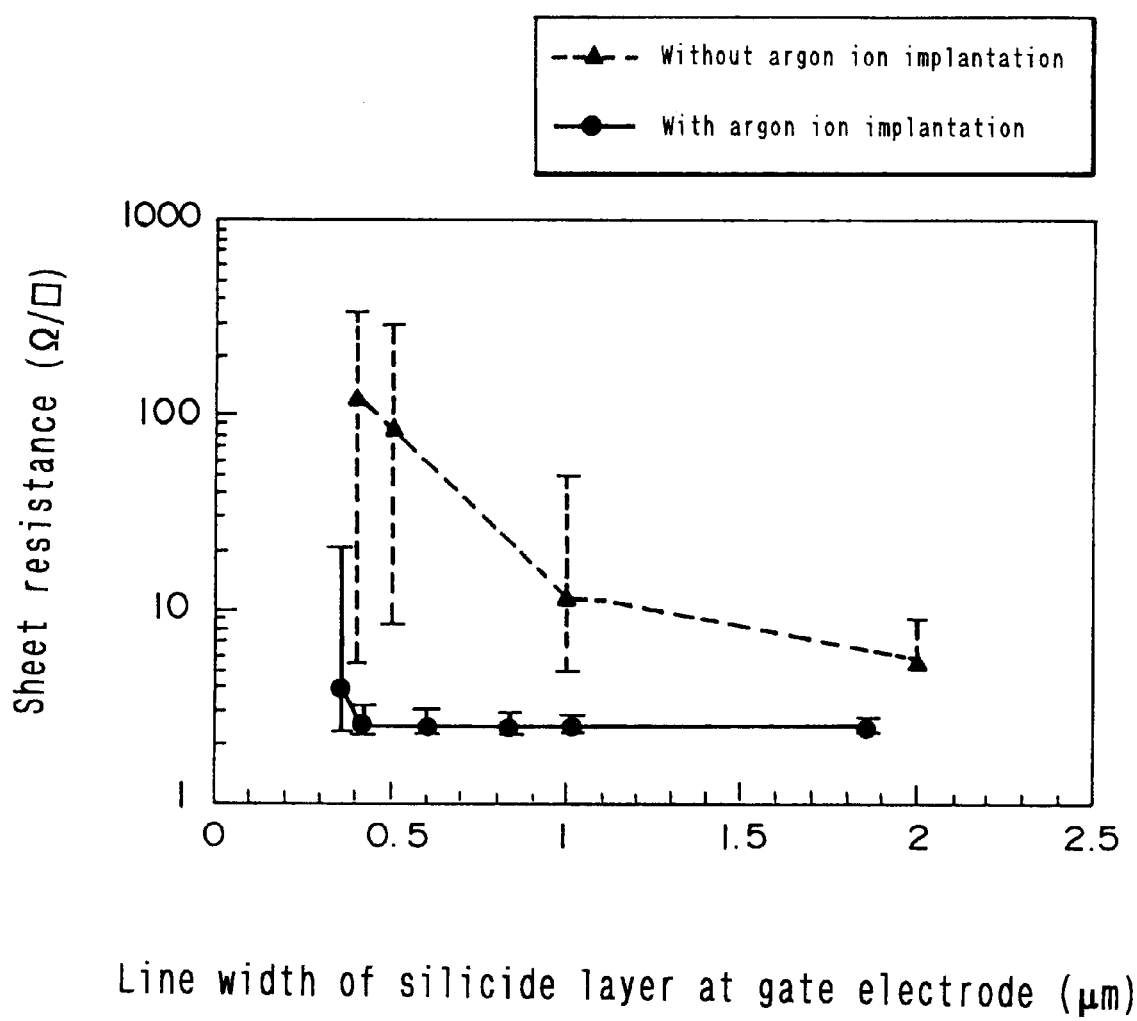
FIG. 7 is a graph comparing the relationship between the line width of the metal silicide layer of the gate electrode and sheet resistance, obtained for samples of the semiconductor device in accordance with the first embodiment of this invention and comparative samples.

Comparisons of the dependency of the sheet resistance of the gate electrode on line width are shown in FIG. 7, both with and without argon ion implantation. In this graph, the line width of the metal silicide layer of the gate electrode is plotted along the horizontal axis and the sheet resistance of the gate electrode at a voltage of 3.3 V is plotted along the vertical axis. The samples in accordance with this invention had basically the same configuration used in the measurements described in (1) above, except that a plurality of samples with different line widths of the titanium silicide layer were provided. Comparative samples were the same as the samples of this invention, except for the argon ion implantation.

Figure 8:
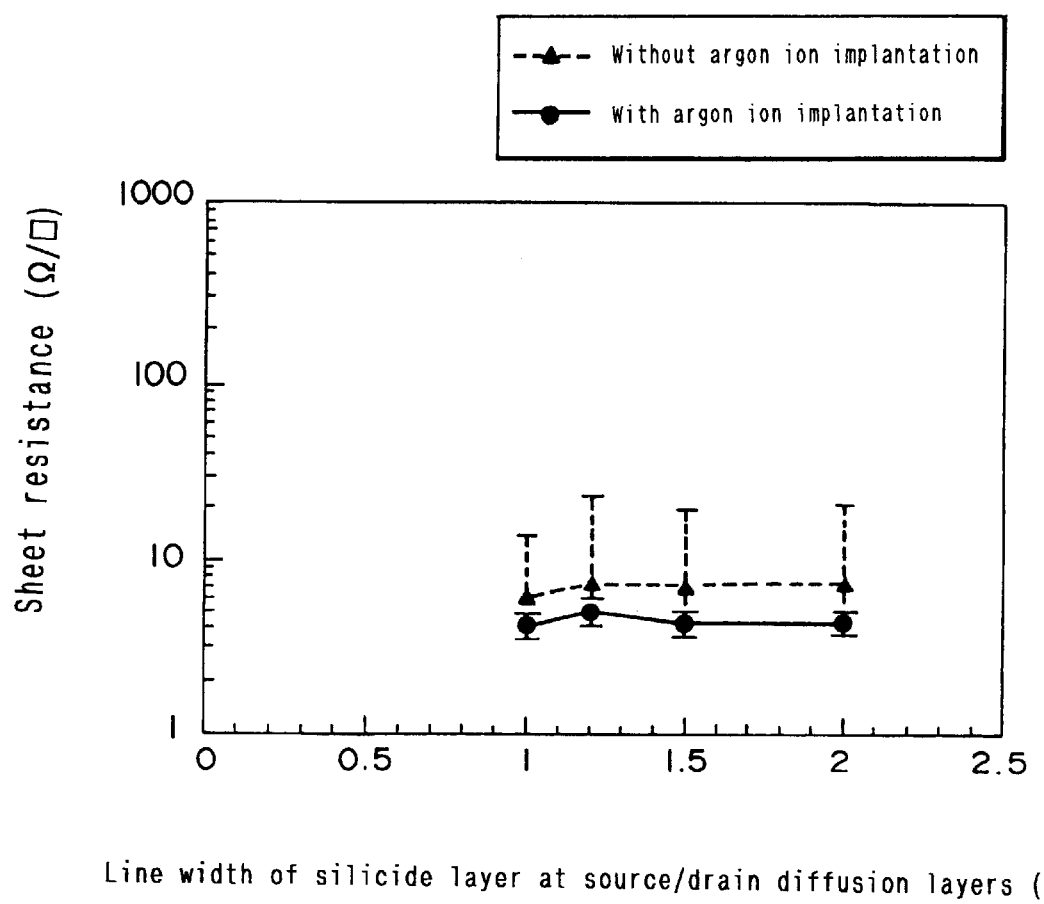
FIG. 8 is a graph comparing the relationship between the line width of the metal silicide layers of the source/drain regions and sheet resistance, obtained for samples of the semiconductor device in accordance with the first embodiment of this invention and comparative samples.

It is clear from FIG. 7 that the sheet resistance was extremely small over a wide range of line widths of the titanium silicide layers of the gate electrodes when the gate electrode surfaces had been made non-crystalline by ion implantation using argon ions, in comparison with samples in which no argon ion implantation was performed. It was also confirmed that the effect of suppressing any rise in the sheet resistance is large, even when the line width of the titanium silicide layer of the gate electrode is small (3) Effect of Argon Ion Implantation on Sheet Resistance of Source/Drain Regions Comparisons of the dependency of the sheet resistance of the source/drain regions on line width are shown in FIG. 8, both with and without argon ion implantation. In this graph, the line width of the titanium silicide layers of the source/drain regions is plotted along the horizontal axis and the sheet resistance of the source/drain regions at a voltage of 3.3 V is plotted along the vertical axis. The samples in accordance with this invention had basically the same configuration used in the measurements described in (1) above, except that a plurality of samples with different line widths of the titanium silicide layers were provided. The source/drain regions were doped with arsenic with an implantation energy of 50 keV an a dosage of $4\times10^{15}/cm^2$.

It is clear from FIG. 8 that the sheet resistance was small over a wide range of line widths of the metal silicide layers of the source/drain regions when the surfaces of the source/drain regions had been made non-crystalline by ion implantation using argon ions, in comparison with samples in which no argon ion implantation was performed.

(4) Effect of Ion Implantation Energy on Junction Leakage Currents

Figure 9:
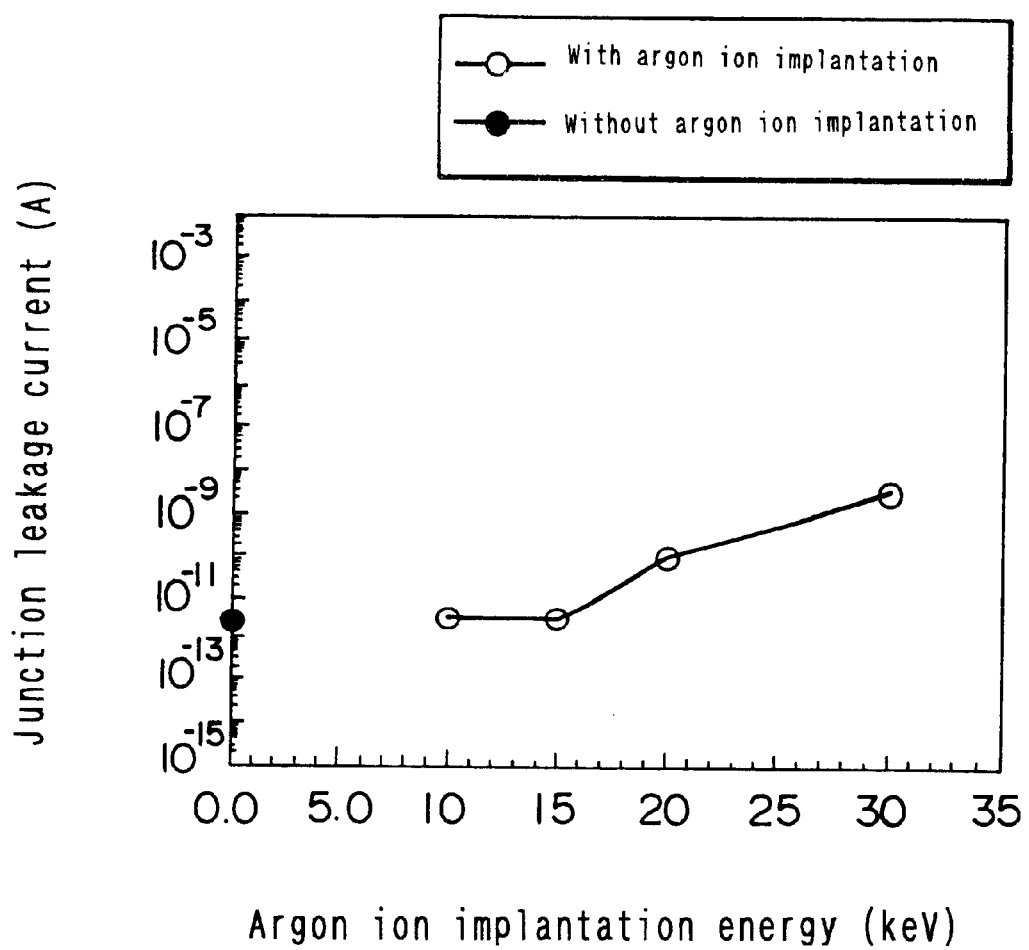
FIG. 9 is a graph of the relationship between argon ion implantation energy and junction leakage currents.

The effect on junction leakage currents of the energy with which argon ions are implanted is shown in FIG. 9. In this graph, argon ion implantation energy is plotted along the horizontal axis and leakage current at a voltage of 3.3 V is plotted along the vertical axis. The samples used in the measurements were the same as those used in the measurements of (3) above. The area of the evaluated region was 41,472 $\mu m^2$ and the peripheral length of this region was 864 $\mu m$.

It is clear from FIG. 9 that an increase in the implantation energy during argon ion implantation leads to an increase in junction leakage current. It is therefore preferable to set the implantation energy during the ion implantation in such a manner that the junction leakage currents do not exceed a predetermined value. In other words, it is thought that crystal defects created by the ion implantation, or defects created by a process of repairing those crystal defects by subsequent thermal processing, that extend beyond the source/drain regions will increase the junction leakage currents. It is therefore preferable to set implantation energy during the ion implantation in such a manner that these crystal defects do not extend beyond the source/drain regions.

It is possible to suppress the leakage currents to the same level as that when no argon ions are implanted, by setting the implantation energy during the ion implantation to a suitable range (no more than 15 keV). Note, however, that the optimal implantation energy depends on the type of element, so it is not possible to set unconditional limits thereon.

(5) Effect of Crystal Defects on Junction Leakage Currents

Figure 10:
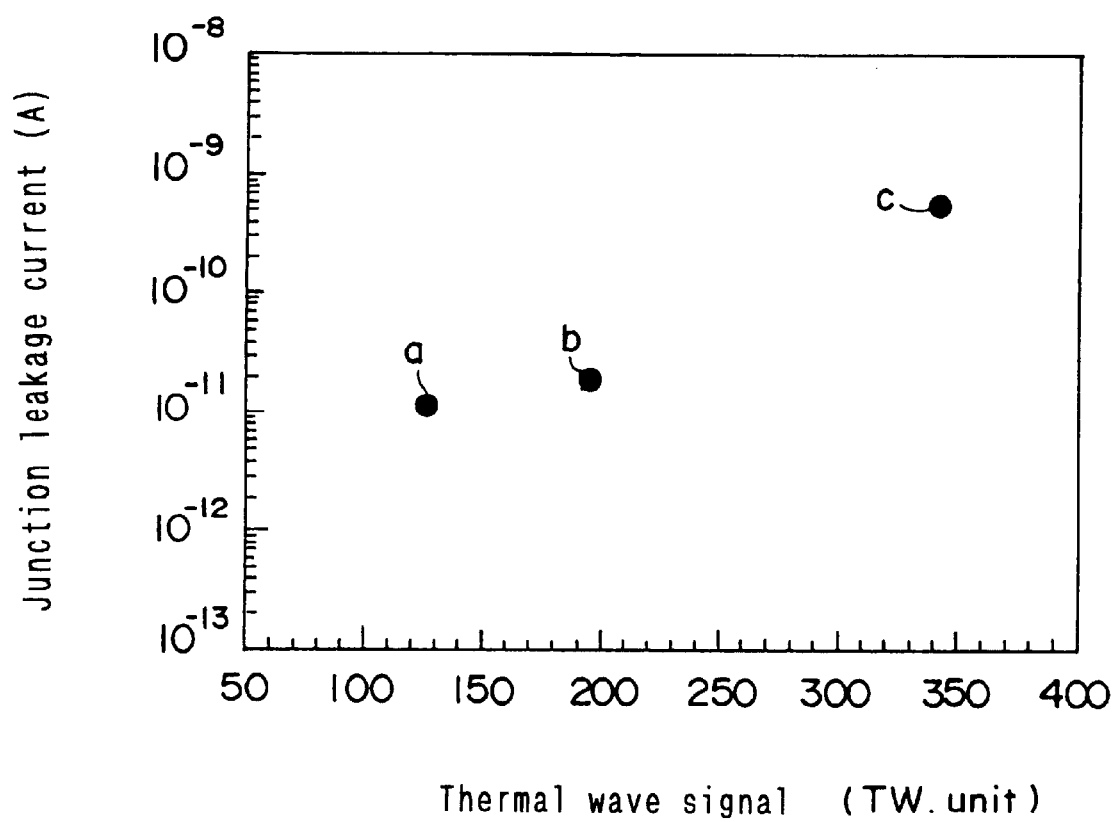
FIG. 10 is a graph of the relationship between thermal wave signals obtained by a thermal wave method and junction leakage currents.

The effect on junction leakage currents of crystal defects is shown in FIG. 10. In this graph, a thermal wave signal obtained by a thermal wave method is plotted along the horizontal axis and junction leakage current at a voltage of 3.3 V is plotted along the vertical axis. This thermal wave method makes it possible to indirectly quantify any damage generated within a silicon substrate, enabling evaluation of crystal defects within the silicon. The samples used in the measurements were basically the same as those used in the measurements of (4) above, but bombarded with argon by ion implantation under different conditions. The argon implantation conditions were as follows:

a. Dosage: $3 \times 10^{14}/cm^2$, implantation energy: 10 keV
b. Dosage: $1 \times 10^{15}/cm^2$, implantation energy: 10 keV
c. Dosage: $3 \times 10^{14}/cm^2$, implantation energy: 30 keV The same symbols are used in FIG. 10 to denote the above argon implantation conditions. Note that the thermal wave signals plotted along the horizontal axis in FIG. 10 are not those of samples in which junction leakage currents are measured, but those of samples in which argon ions have been implanted into bare silicon under the above described conditions a to c. The area of the region in which the junction leakage currents were evaluated was 250,000 $\mu m^2$ and the peripheral length of this region was 2000 $\mu m$.

It is clear from FIG. 10 that the junction leakage currents increase as the value of the thermal wave signal increases. This indicates that an increase in the number of crystal defects leads to an increase in junction leakage currents.

configuration of Second Embodiment

Figure 11:
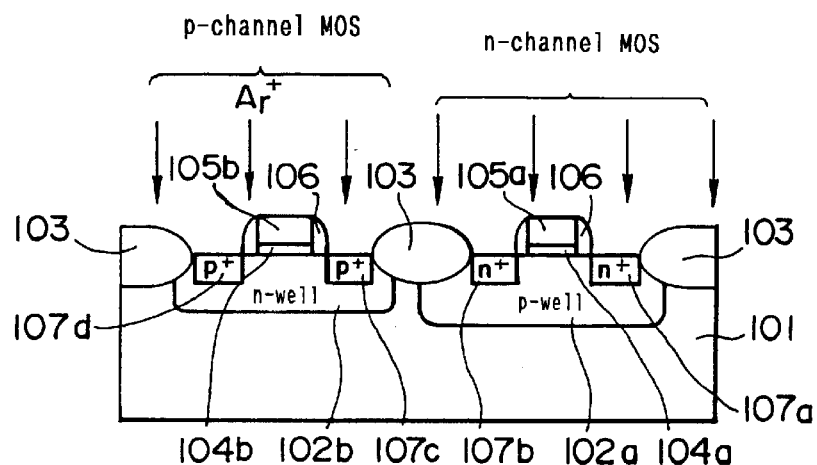
FIG. 11 is a schematic cross-sectional view of a step in the method of fabricating a semiconductor device in accordance with a second embodiment of this invention.
Figure 12:
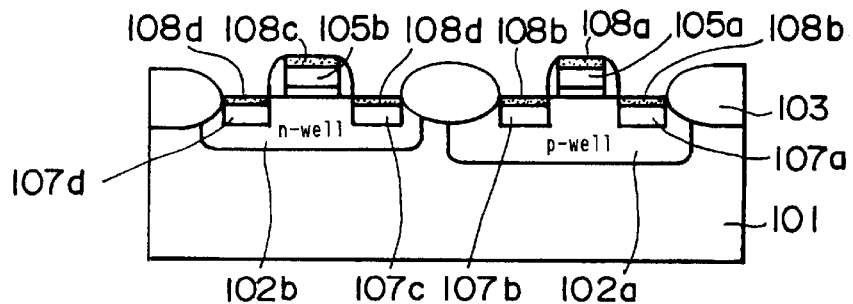
FIG. 12 is a schematic cross-sectional view of another step in the method of fabricating a semiconductor device in accordance with the second embodiment of this invention.
Figure 13:
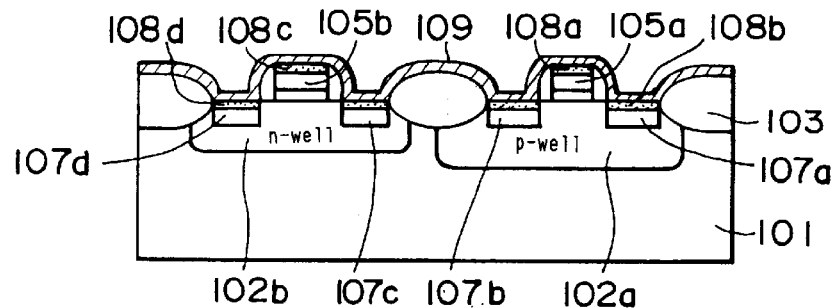
FIG. 13 is a schematic cross-sectional view of a further step in the method of fabricating a semiconductor device in accordance with the second embodiment of this invention.
Figure 14:
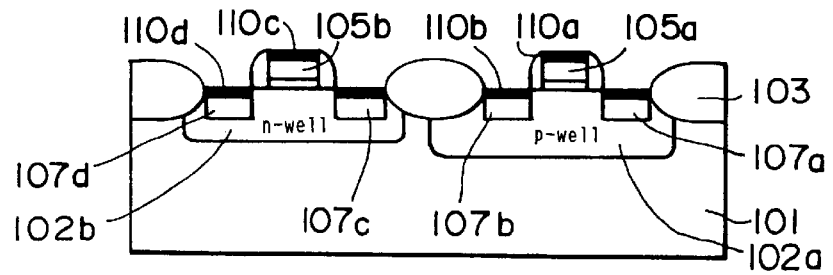
FIG. 14 is a schematic cross-sectional view of the semiconductor device obtained by the fabrication method of FIGS. 11 to 13.

A schematic cross-sectional view of another embodiment of this invention applied to a CMOS element is shown in FIG. 14, and schematic cross-sectional views of steps in the fabrication of the semiconductor device of FIG. 14 are shown in FIGS. 11 to 13.

The semiconductor device shown in FIG. 14 could be fabricated by the process described below with reference to FIGS. 11 to 13, for example.

(1) First of all, twin wells are formed by a commonly-used method. In other words, a first silicon oxide film is formed in an oxygen environment on the silicon substrate 101. Photoresist for the creation of well diffusion layers is then applied and patterned by a projected-light method, to form a mask. An ion implantation method is used to implant phosphorous, then the photoresist is removed. Photoresist for the creation of a p-type well diffusion layer is next applied and patterned by a projected-light method, to form a mask. An ion implantation method is used to implant boron instead of phosphorous, then the photoresist is removed. Subsequently, a thermal diffusion method is used to form an n-type well diffusion layer 102b and a p-type well diffusion layer 102a.

After a silicon nitride film has been formed by CVD over the first silicon oxide film, photoresist is applied thereto and patterned, and a portion of the silicon nitride film which will form an element separation region in the first silicon oxide film is removed by dry etching. Next, after the photoresist has been removed, this silicon nitride film is used as a mask to form the element separation region 103 from the silicon oxide film by subjecting it to thermal oxidation in an oxygen environment.

The silicon nitride film is removed by means such as phosphoric acid, thermal oxidation is performed to remove impurities from the substrate surface before the gate oxide film is formed thereon, and a second silicon oxide film is formed. After this second silicon oxide film has been removed by etching, a thermal oxidation method is used to form gate oxide films 104a and 104b. A polycrystalline silicon layer is next formed by CVD, photoresist is applied and patterned, then dry etching is performed to form a gate electrode 105a of an n-channel MOS transistor and a gate electrode 105b of a p-channel MOS transistor, then the photoresist is removed. Next, to prevent shorting between the gate electrodes and the source/drain regions after the silicification, an oxide film is formed by CVD then dry etching is performed to form the side-wall spacers 106. Photoresist is next applied for the creation of the source/drain regions of the n-channel MOS transistor and the implantation of impurities into the gate electrode 105a, and this photoresist is patterned in such a manner that an aperture is formed in a portion corresponding to the region in which the n-channel MOS transistor will be formed. An n-type impurity such as arsenic is then implanted by an ion implantation method to form each of source/drain regions 107a and 107b that are high-density n-type diffusion layers and also introduce this impurity into the gate electrode 105a, and then the photoresist is removed.

In a similar manner, photoresist is applied for the creation of the source/drain regions of the p-channel MOS transistor and the implantation of impurities into the gate electrode 105b, and this photoresist is patterned in such a manner that an aperture is formed in a portion corresponding to the region in which the p-channel MOS transistor will be formed. A p-type impurity such as boron is then implanted by an ion implantation method to form each of source/drain regions 107c and 107d that are high-density p-type diffusion layers and also introduce this impurity into the gate electrode 105b, and then the photoresist is removed. Finally, thermal processing is performed in a nitrogen environment to activate the implanted impurities (FIG. 11).

(2) After any natural oxide film or the like that is present on the surfaces of the gate electrodes 105a and 105b (105) and the source/drain regions 107a, 107b, 107c, and 107d (107) have been removed, argon ions are implanted to make the surfaces of the gate electrodes 105 and source/drain regions 107 non-crystalline. If the depth of the source/drain regions 107 is 0.2 $\mu m$, for example, and thermal processing is performed after the argon ion implantation for 20 minutes at 800 to 900° C., the implantation energy during this time is preferably no more than 15 keV, for example, to ensure that crystal defects created by the implanted argon ions, or crystal defects created by a process of repairing those crystal defects by immediately subsequent thermal processing, do not extend further than the depths of the source/drain regions 107. In this manner, non-crystalline regions 108a and 108c are formed in the surfaces of the gate electrodes 105a and 105b, and non-crystalline regions 108b and 108d are formed in the surfaces of the source/drain regions 107a and 107b of the n-channel MOS transistor and the source/drain regions 107c and 107d of the p-channel MOS transistor (FIG. 12).

This step is important in that the implantation of specific ions such as argon ions into the surfaces of the gate electrodes 105 and source/drain regions 107 encourages the silicon thereof to become non-crystalline, as previously described. It should be noted, however, that it is preferable that any crystal defects formed by the ion implantation do not extend beyond the source/drain regions 107. In other words, it is preferable that any crystal defects created by these ions of specific atoms, such as argon, or crystal defects created by a process of repairing the crystal defects by subsequent thermal processing, do not extend past the outer sides of the source/drain regions 107. As a result, the leakage currents generated by the junctions between the source/drain regions and the well diffusion layer can be kept to the same level as that when this ion implantation is not performed with the aim of making the silicon non-crystalline. For that reason, it is preferable that the implantation energy used during the implantation of ions of atoms that do not function as donors or acceptors, such as argon ions, is set to provide conditions such that these crystal defects do not extend further than the depths of the impurity diffusion layers oft he source/drain regions.

Since ions of atoms that do not function as donors or acceptors, such as argon ions, are used in the ion implantation intended to make the silicon non-crystalline, this step makes it possible to perform ion implantation in a blanket fashion for both n-channel and p-channel MOS transistors simultaneously. In other words, the entire wafer surface can be processed simultaneously, making it possible to reduce wafer processing costs without necessitating a mask formation step designed to prevent counter-doping.

(3) Next, sputtering is used to form a metal layer 109, which is a layer of a metal that enables the creation of a silicide, such as titanium, cobalt, nickel, tantalum or platinum, or an alloy thereof (FIG. 13). Thermal processing is then performed with the aid of a lamp annealer to form metal silicide layers 110a and 110c on the surfaces of the gate electrodes 105a and 105b, and to form metal silicide layers 110b and 110d in a self-aligning manner on the source/drain regions 107a and 107b of the n-channel MOS transistor and the source/drain regions 107c and 107d of the p-channel MOS transistor. Selective etching is then performed to remove the non-reactive metal layer from the side-wall spacers 106 and the element separation region 103 (FIG. 14).

As described above, this embodiment is similar to the previous embodiment in that it has a step (2) in which ion implantation is used to implant ions of specific atoms that do not function as donors or acceptors into the surfaces of the gate electrodes 105 consisting of polycrystalline silicon and the source/drain regions 107a, 107b, 107c, and 107d consisting of n-type or p-type impurity diffusion layers, to make these surfaces non-crystalline, before the step (3) of forming the metal layer that enables the creation of a silicide. This increases the reactivity of the silicon configuring the gate electrodes 105 and the source/drain regions 107a, 107b, 107c, and 107d consisting of n-type or p-type impurity diffusion layers, making it possible to perform the silicification more reliably. Therefore, if the width of the gate electrode and impurity diffusion layers have become narrower as a result of the reduction in dimensions of elements, and even if the source/drain regions have also become shallower, it is possible to suppress any rise in the sheet resistance of the metal silicide layers and it is also possible to obtain satisfactory metal silicide layers without affecting the density of n-type or p-type impurities within the source/drain regions. In addition, since the ions that are implanted are argon or the like, not an n-type or p-type impurity such as arsenic, phosphorous, or BF2, there is no danger of counter-doping with respect to n-type or p-type impurities.

Although the present invention was described above with reference to specific embodiments, this invention should not be taken as being limited to those embodiments and it should be obvious to those skilled in the art that it can be modified in various different ways within the scope of the claims laid out hereinbelow.

What is claimed is:

1. A method of forming a semiconductor device, comprising:

(a) providing a semiconductor substrate;

(b) forming impurity regions in the semiconductor substrate;

(c) amorphizing the impurity regions by implanting atoms that do not function as donors or acceptors into the impurity regions, the atoms being selected from the group consisting of argon, krypton, xenon and germanium;

(d) subsequently forming a metal layer on the surface of the impurity regions, the metal being capable of forming a silicide; and (e) thermally treating the device to convert the metal into a silicide wherein first crystal defects are created in the semiconductor substrate by the amorphizing step and second crystal defects are created by a process of repairing the first crystal defects by subsequent thermal processing, and the energy for ion implanting is set such that the first and second defects do not extend beyond the impurity regions.

2. The method of claim 1, further comprising:

(f) forming an insulating layer on the substrate;

(g) forming a conductive layer comprising silicon on the insulating layer;

wherein the amorphizing step (c) includes implanting the atoms into the conductive layer to amorphize the conductive layer, and wherein the forming step (d) includes forming the metal layer on the surface of the conductive layer.

3. The method of claim 2, wherein the impurity regions form a drain and a source region of a transistor device and the conductive layer forms a gate region of the transistor device.

4. The method of claim 1, further comprising:

removing a natural oxide film from the substrate surface before the amorphizing step.

* * * * *